(12) United States Patent
Garrity et al.

(10) Patent No.: US 8,400,339 B2
(45) Date of Patent: Mar. 19, 2013

(54) CORRELATED-LEVEL-SHIFTING AND CORRELATED-DOUBLE-SAMPLING SWITCHED-CAPACITOR GAIN STAGES, SYSTEMS IMPLEMENTING THE GAIN STAGES, AND METHODS OF THEIR OPERATION

(75) Inventors: Douglas A. Garrity, Gilbert, AZ (US); Brandt Braswell, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 134 days.

(21) Appl. No.: 13/075,956

(22) Filed: Mar. 30, 2011

(65) Prior Publication Data

US 2012/0249237 A1   Oct. 4, 2012

(51) Int. Cl.
*H03M 1/62* (2006.01)
*H03M 1/84* (2006.01)
*H03M 1/88* (2006.01)

(52) U.S. Cl. ................... 341/139; 341/150
(58) Field of Classification Search ........... 341/150, 341/139, 144, 155, 142, 153; 326/62, 47
See application file for complete search history.

(56) References Cited

U.S. PATENT DOCUMENTS

| | | | |
|---|---|---|---|
| 5,644,313 A | 7/1997 | Rakers et al. | |
| 6,037,836 A | 3/2000 | Yoshizawa | |
| 6,215,337 B1 * | 4/2001 | Bazarjani | 327/91 |
| 6,608,583 B1 * | 8/2003 | Konno | 341/155 |
| 7,034,737 B1 * | 4/2006 | Huang | 341/172 |
| 7,064,700 B1 | 6/2006 | Garrity et al. | |
| 7,595,666 B2 | 9/2009 | Braswell et al. | |
| 8,026,760 B1 | 9/2011 | Prasad | |
| 8,198,937 B1 * | 6/2012 | Vilas Boas et al. | 330/9 |
| 2009/0033371 A1 | 2/2009 | Braswell et al. | |

OTHER PUBLICATIONS

Enz, C., et al., Circuit Techniques for Reducing the Effects of Op-Amp Imperfections: Autozeroing, Correlated Double Sampling, and Chopper Stabilization, Proceedings of the IEEE, vol. 84, No. 11, Nov. 1996.

Garrity, D, et al., A Single Analog-to-Digital Converter that Converts Two Separate Channels (I and Q) in a Broadband Radio Receiver, IEEE JSSC, vol. 43, No. 6, Jun. 2008.

Nagaraj, K., et al., Switched-Capacitor Integrator with Reduced Sensitivity to Amplifier Gain, Electronic Letter, vol. 22, No. 21, Oct. 9, 1986.

Inagaraj, K., et al., Switched-Capacitor Integrator with Reduced Sensitivity to Amplifier Gain, Electronic Letter, vol. 22, No. 21, Oct. 9, 1986.

(Continued)

*Primary Examiner* — Peguy Jean Pierre
(74) *Attorney, Agent, or Firm* — Sherry W. Schumm

(57) ABSTRACT

Embodiments of apparatus and methods for applying a gain to an input signal are provided. An embodiment of a switched-capacitor gain stage circuit includes an input node, an output node, an operational amplifier, a correlated-double-sampling portion, a correlated-level-shifting portion, and a switching configuration. The operational amplifier has a first amplifier input, a second amplifier input, and an amplifier output. The correlated-double-sampling portion includes a plurality of sampling capacitors arranged in parallel and selectively coupled between the input node and a central node, and an offset storage capacitor including a first terminal coupled to the first amplifier input. The correlated-level-shifting portion includes a correlated-level-shifting capacitor including a first terminal coupled to the output node. The switching configuration has multiple switches that are controllable sequentially to place the gain stage circuit in a sampling state, an approximate output voltage storage state, a level shifting and gain state, and an output state.

20 Claims, 8 Drawing Sheets

OTHER PUBLICATIONS

Gregorie, B. et al., An Over-60 dB True Rail-to-Rail Performance Using Correlated Level Shifting and an Opamp With Only 30 dB Loop Gain, IEEE JSSC, vol. 43, No. 12, Dec. 2008.

U.S. Appl. No. 13/075,844, Garrity, et al., "Correlated-Level-Shifting and Correlated-Double-Sampling Switched-Capacitor Gain Stages, Systems Implementing the Gain Stages, and Methods of Their Operation", filed Mar. 30, 2011, Office Action—Noticed of Allowance mailed Aug. 23, 2012.

Nagaraj, K., et al., "Switched-Capacitor Circuits with Reduced Sensitivity to Amplifier Gain", IEEE Transactions on Circuits and Systems, vol. CAS-34, No. 5, May 1987, pp. 571-574.

* cited by examiner ns that are implemented in one or more integrated circuits.

CORRELATED-LEVEL-SHIFTING AND CORRELATED-DOUBLE-SAMPLING SWITCHED-CAPACITOR GAIN STAGES, SYSTEMS IMPLEMENTING THE GAIN STAGES, AND METHODS OF THEIR OPERATION

RELATED APPLICATION

This application is related to co-pending, U.S. patent application Ser. No. 13/075,844, entitled "CORRELATED-DOUBLE-SAMPLING SWITCHED-CAPACITOR GAIN STAGES, SYSTEMS IMPLEMENTING THE GAIN STAGES, AND METHODS OF THEIR OPERATION," filed concurrently herewith.

TECHNICAL FIELD

Embodiments relate to switched-capacitor gain stages, systems in which such gain stages are implemented, and methods of their operation.

BACKGROUND

A variety of analog signal processing circuits include a gain stage configured to amplify an input analog signal. For example, switched-capacitor gain circuits are commonly used to provide such amplification. A typical switched-capacitor gain circuit includes an amplifier (e.g., an operational amplifier) and a set of capacitors onto which an input signal sample may be stored. The stored input signal is subsequently amplified and output from the gain circuit. Although contemporary switched-capacitor gain circuits function well in a variety of applications, they do have some drawbacks. For example, the finite gain of the amplifier, flicker noise (sometimes referred to as "1/f noise"), and DC offsets detrimentally affect the achievable accuracy of such circuits.

To compensate for amplifier imperfections that limit the achievable accuracy of switched-capacitor circuits, a technique referred to as correlated-double-sampling has been implemented in some gain circuits. Correlated-double-sampling generally refers to a sampling technique in which the strength of a signal at a node is determined as a difference between the strength of the signal at the node when the signal is coupled to the node and the strength of the signal at the node when the signal is decoupled from the node. Although correlated-double-sampling sampling techniques may improve the achievable accuracy of switched-capacitor circuits, the accuracy improvements come at a cost. More particularly, some prior correlated-double-sampling, switched-capacitor circuits include significantly more circuitry to perform correlated-double-sampling, thus increasing the overall cost and complexity of the gain stage. In addition or alternatively, many prior correlated-double-sampling, switched-capacitor circuits impose limitations on the bandwidth of the input signal that may be processed.

DETAILED DESCRIPTION

Figure 1:
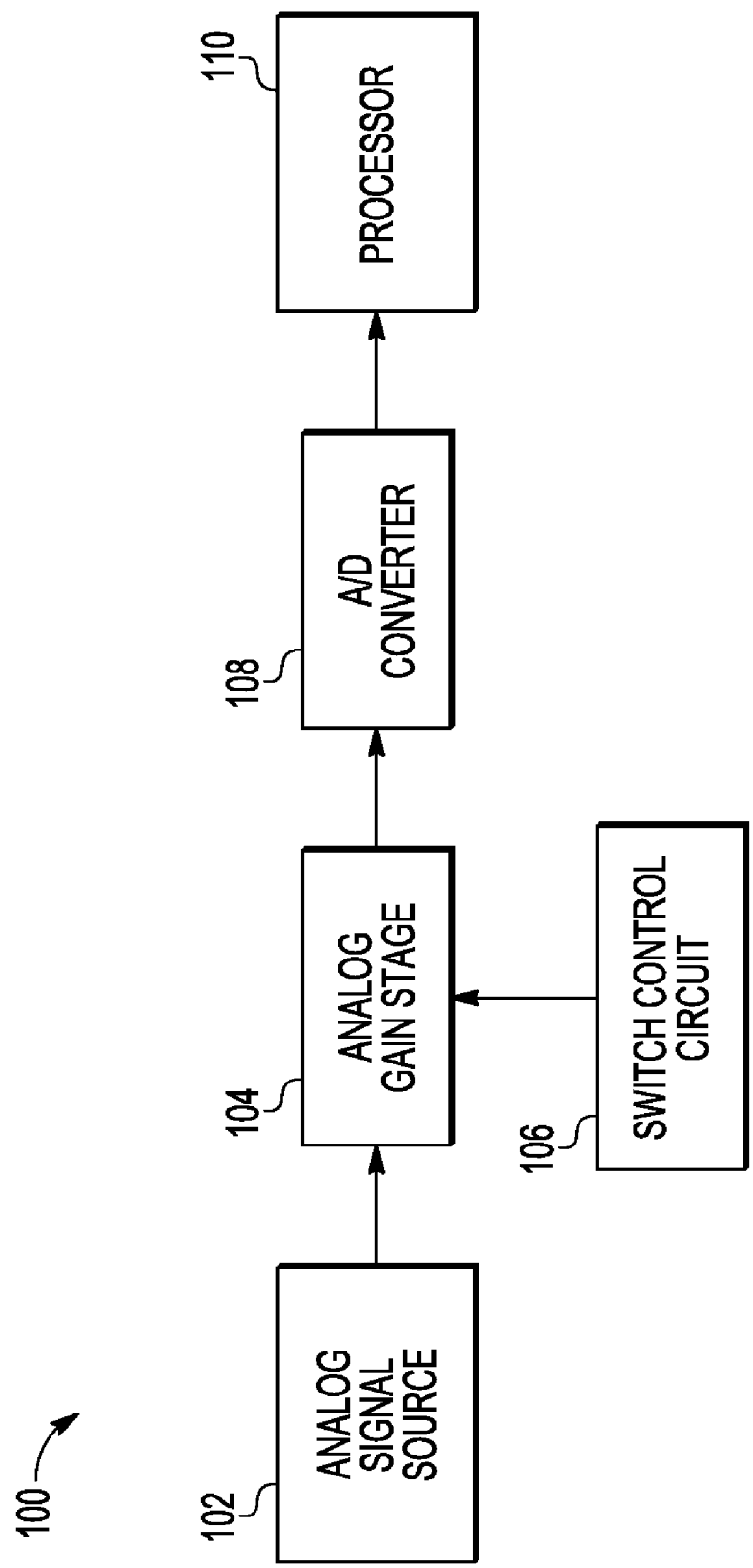
FIG. 1 is a simplified block diagram of an embodiment of an electronic system within which one or more gain stages according to various embodiments may be incorporated.

Embodiments include gain stage circuits in which correlated-double-sampling and correlated-level-shifting techniques are implemented, and methods for operating such gain stage circuits. As described above, prior switched-capacitor circuits suffer from issues relating to finite amplifier gain, flicker noise, and input offset voltages. In addition, the achievable output swing of amplifiers that are typically used in prior switched-capacitor circuits limits the range of input signals that can be processed without additional attenuation in the signal path. Finally, using prior techniques, extremely high amplifier open-loop gains (e.g., on the order of 3,000,000 or 130 dB) are needed for applications that require very precise gains, which is undesirable in some circumstances.

As will be explained in more detail below, the correlated-level-shifting technique compensates for finite amplifier gain and limited output swing, and the correlated-double-sampling technique compensates for finite amplifier gain, flicker noise, and input offset voltage. The various gain stage embodiments described herein may be used in conjunction with or integrated within any of a variety of electronic systems and circuits that may benefit from including a gain stage having the advantages and characteristics of the disclosed embodiments. In a particular embodiment, an embodiment of a gain stage may be utilized as an input stage to an analog to digital converter.

Various embodiments of gain stage circuits are discussed below. In some of the below discussed embodiments, the gain stage circuits are described to include "capacitors" and "switches." It is to be understood that any reference to a "capacitor" or "switch" in the description or claims should be interpreted to mean either a single, distinct component (e.g., a single capacitor or switch) or a circuit or network that includes multiple interconnected components of a particular type (e.g., a capacitor circuit or a switching circuit). Similarly, references to a "capacitor circuit" or a "switching circuit" in the description or claims may be interpreted to mean multiple interconnected components of a particular type or a single, distinct component. In various embodiments, the components (e.g., the capacitors and switches) may be implemented as discrete (i.e., separately packaged) components or compo- As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment, assuming that the functionality of the given circuit is not adversely affected.

In the description herein, various circuit elements are described as being coupled to a "ground reference." It is to be understood that the various circuit elements may be coupled to a same ground reference (i.e., a same reference voltage or ground), in an embodiment, or to different ground references (i.e., different reference voltages) in various other embodiments. Therefore, references to various circuit elements as being coupled to "a ground reference" should not be interpreted as meaning that all such circuit elements are coupled to the same ground reference, although they may be, in an embodiment. Similarly, references to various circuit elements as being coupled to a "first," "second," or "third" ground reference may mean that the circuit elements are coupled to a same ground reference or to different ground references, in various embodiments.

FIG. 1 is a simplified block diagram of an embodiment of an electronic system 100 within which one or more gain stages according to various embodiments may be incorporated. Electronic system 100 may be a stand-alone system, or may form a portion of a larger system, including but not limited to a computer, a wired or wireless communication device (e.g., a cellular telephone or radio), a radio frequency (RF) receiver, an RF transmitter, an appliance, a gaming system, a sensor interface, an electricity meter, a power meter, a video recording and display system, a vehicle braking unit, and an engine control unit, to name a few. System 100 includes an analog signal source 102, an analog gain stage 104, a switch control circuit 106, an analog to digital (A/D) converter 108, and a processor 110. Analog signal source 102 may be any suitable source of an analog signal, including but not limited to a sensor, an audio input circuit, a receiver, a pressure sensor in an engine or tire, a camera, a current transformer, and so on.

According to an embodiment, the analog signal produced by analog signal source 102 is received and processed by analog gain stage 104. As will be described in greater detail below, analog gain stage 104 includes a finite gain amplifier, sampling capacitors, an offset storage capacitor, a correlated-level-shifting capacitor, a load capacitor, and a plurality of switches that are controlled via switch control signals produced by switch control circuit 106. The inclusion of the offset storage capacitor and the method by which the switches are controlled results in the production of an output voltage signal, by analog gain stage 104, which the amplifier offset voltage has been cancelled, flicker noise is suppressed, and the finite gain of amplifier is compensated. Further, the inclusion of the a correlated-level-shifting and load capacitors and the method by which the switches are controlled results in the production of an output voltage signal that has been compensated for finite amplifier gain and limited output swing.

According to an embodiment, analog gain stage 104 may be an input stage to A/D converter 108 (and thus may form a portion of A/D converter 108). Alternatively, analog gain stage 104 may be distinct from A/D converter 108 as shown in FIG. 1. Either way, the output voltage signal produced by analog gain stage 104 may be sampled by A/D converter 108, which may produce a series of digital values representing the output voltage signal. These digital values may be further processed by processor 110. Processor 110 may be, for example, a general or special purpose processor, a digital signal processor, an application specific integrated circuit, or various other types of circuits configured to process digital samples.

Figure 2:
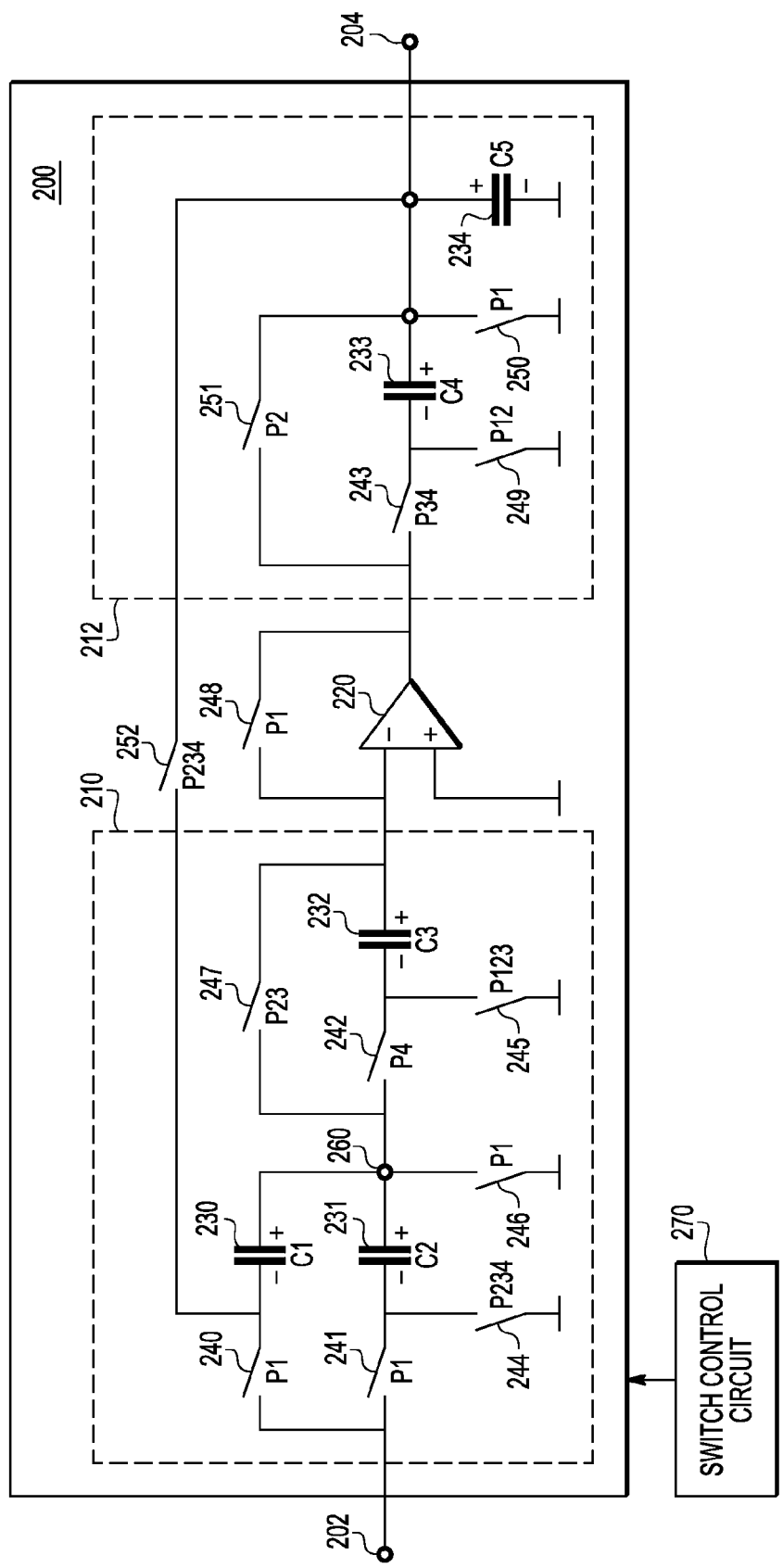
FIG. 2 is a simplified schematic diagram of a gain stage circuit, according to an example embodiment.

FIG. 2 is a simplified schematic diagram of a gain stage circuit 200 (e.g., analog gain stage 104, FIG. 1), according to an example embodiment. Although the simplified schematic shown in FIG. 2 (and FIGS. 4-6) is depicted in a single-ended configuration in order to simplify the explanation, a practical embodiment may be designed to be differential throughout a device within which a gain stage embodiment is implemented. Gain stage circuit 200 includes an input node 202 for receiving an input voltage signal, $v_{IN}$, an output node 204 for providing an output voltage, $v_{OUT}$ (e.g., a voltage sample sequence that is derived from the input voltage signal), an amplifier 220, a plurality of capacitors 230-234, and a plurality of switches 240-252. In an embodiment, amplifier 220 is an operational amplifier with a finite gain. Portion 210 of gain stage circuit 200 may be referred to as a "correlated-double-sampling" portion, and portion 212 of gain stage circuit 200 may be referred to as a "correlated-level-shifting" portion. The correlated-double-sampling portion 210 includes capacitors 230-232 and switches 240-242, 244-246. The correlated-level-shifting portion 212 includes capacitors 233, 234 and switches 243, and 249-251. Amplifier 220 and switches 248, 252 may be considered to be part of either or both portions 210, 212.

Each of capacitors 230-234 may be considered to have a first terminal and a second terminal. For purposes of convenience, capacitors 230-234 of FIG. 2 are shown with polarity markings ("+" and "−"). These markings are used solely for the purpose of indicating how the first and second terminals of each of the capacitors 230-234 are coupled to various nodes in gain stage circuit 200 in different operational states, and the markings are not meant to imply that any type of directional capacitors are necessarily used in gain stage circuit 200, although directional capacitors may be used. In the event that directional capacitors are used, their polarities may be the same as or different from the polarities shown in FIG. 2, in various embodiments.

According to an embodiment, the input node 202 is coupled, as shown, to first and second capacitor legs. As used herein, the term "capacitor leg" means a portion of a circuit that includes one or more capacitors electrically coupled between a first end and a second end of the circuit portion, and that may be characterized as having a particular capacitance. In the correlated-double-sampling portion 210 of gain stage circuit 200, the first capacitor leg (including a first switch 240 in series with a first capacitor C1 230) and the second capacitor leg (including a second switch 241 in series with a second capacitor C2 231) are coupled in parallel with each other between their first and second ends, where the first ends are coupled to the input node 202, and the second ends are coupled to a "central node" 260. A third capacitor leg (including a third switch 242 in series with a third capacitor C3 232) has its first end coupled with the central node 260, and its second end coupled with the inverting input of amplifier 220. The non-inverting input of amplifier 220 may be coupled to a ground reference, in an embodiment.

In the correlated-level-shifting portion 212 of gain stage circuit 200, a fourth capacitor leg (including a fourth switch 243 in series with a fourth capacitors C4 233) has its first end coupled with the output of amplifier 220, and its second end coupled with the output node 204. A fifth capacitor 234 has its first end coupled with the output node 204 and its second end coupled with a ground reference.

The switches 240-243 in the first, second, third, and fourth capacitor legs form a portion of a switching configuration, which also includes switches 244-252. As will be described in more detail below, the switching configuration enables capacitors C1, C2, C3, C4, and C5 230-234 to be electrically coupled and de-coupled from the input node 202, central node 260, ground reference, amplifier output 204, and output node 204 in various manners during transition of the gain stage circuit 200 through various states. According to an embodiment, a fifth switch 252 is coupled between the output node 204 and a connection point between capacitor C1 230 and switch 240. A sixth switch 244 is coupled between a ground reference and a connection point between capacitor C2 231 and switch 241. A seventh switch 245 is coupled between a ground reference and a connection point between capacitor C3 232 and switch 242. An eighth switch 246 is coupled between a ground reference and the central node 260. In an embodiment, the sixth and eighth switches 244, 246 are coupled to different ground references (e.g., different reference voltages). In another embodiment, the sixth and eighth switches 244, 246 may be coupled to the same ground reference. A ninth switch 247 is coupled between the central node 260 and the inverting input of amplifier 220 (i.e., switch 247 is coupled in parallel with the third capacitor leg that includes capacitor C3 232). A tenth switch 248 is coupled between the output and the inverting input of amplifier 220. An eleventh switch 249 is coupled between a ground reference and a connection point between capacitor C4 233 and switch 243. A twelfth switch 250 is coupled between a ground reference and the output node 204. Finally, a thirteenth switch 251 is coupled between the output node 204 and the output of amplifier 220 (i.e., switch 251 is coupled in parallel with the fourth capacitor leg that includes capacitor C4 233).

Figure 3:
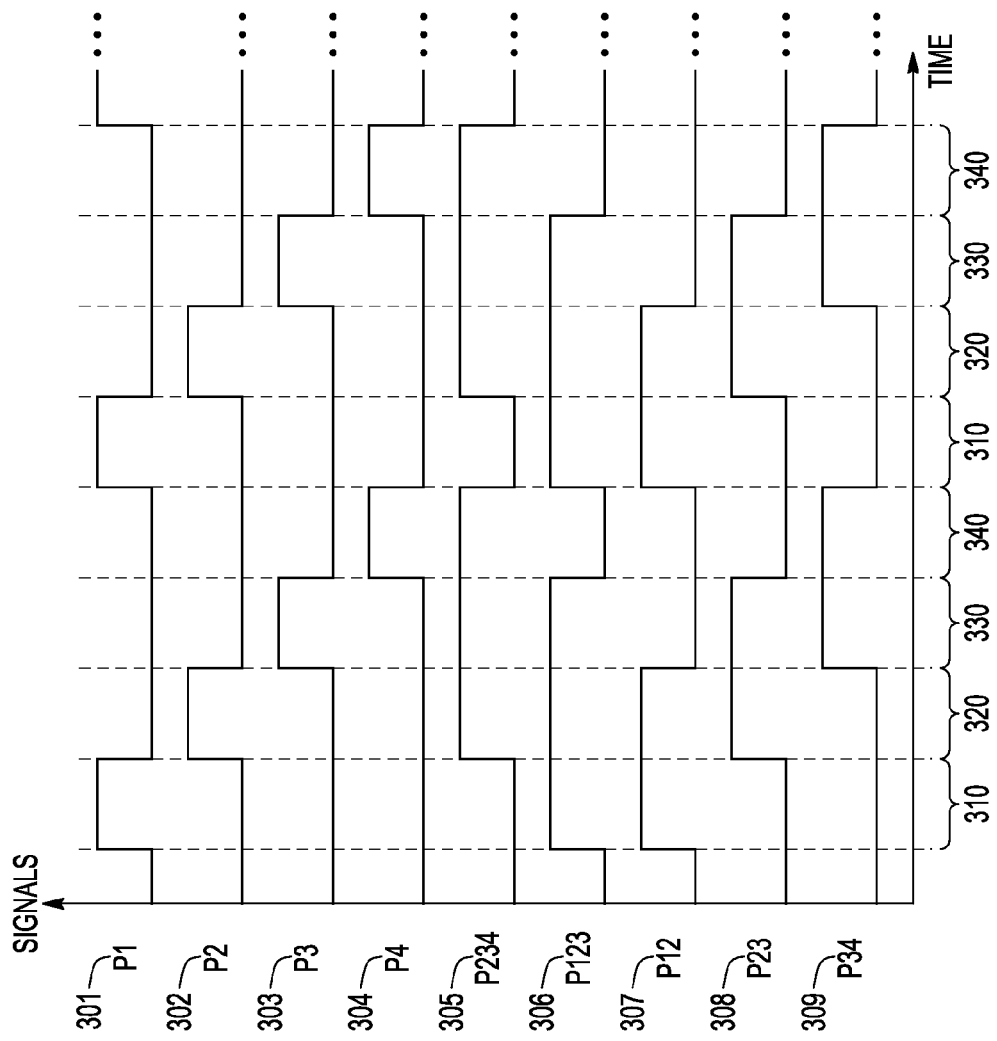
FIG. 3 is a diagram depicting the relative timing of example switch control signals that influence the operation of the gain stage of FIG. 2, according to an example embodiment.

Each of switches 240-252 may be implemented as a transistor (e.g., a metal oxide semiconductor field effect transistor (MOSFET), micro-electromechanical switch (MEMS), and so on), which may be placed in a conducting or non-conducting state based one of a plurality of switch control signals provided by switch control circuit 270. FIG. 3 is a diagram depicting the relative timing of example switch control signals 301-309, which may be provided by switch control circuit 270, and which may influence the operation of the gain stage circuit 200 of FIG. 2, according to an example embodiment. Although switch control signal P3 303 may not actively control any particular switch, signal P3 303 may be used to generate other signals (e.g., signals P234, P123, P23, and P34), and signal P3 303 is included in FIG. 3 to clearly indicate a third phase of the gain stage circuit 200. To facilitate understanding, FIGS. 2 and 3 should be viewed together, along with FIGS. 4-8 as referred to below.

As mentioned above, and according to an embodiment, a plurality of switch control signals 301-309 are provided to gain stage circuit 200 (and more particularly to switches 240-252) by switch control circuit 270. The switches in FIG. 2 are labeled with their respective governing switch control signal (e.g., P1, P2, P4, P234, P123, P12, P23, P34). In the embodiments described herein, when a switch control signal 301-309 is in a relatively high voltage state, a switch to which the switch control signal 301-309 is provided will be in a conducting state (i.e., closed), thus producing a short circuit across the switch. Conversely, when a switch control signal 301-309 is in a relatively low voltage state, a switch to which the switch control signal 301-309 is provided will be in a non-conducting state (i.e., open), thus producing an open circuit at the switch. Those of skill in the art would understand that modifications to the apparatus and methods described herein could be made so that some or all of switches 240-252 alternatively may be controlled in an opposite manner (e.g., a high switch control voltage corresponds to a non-conducting switch state, and a low switch control voltage corresponds to a conducting switch state). Those of skill in the art also would understand that delayed and/or compliment versions of the various switch control signals 301-309 may be used to optimally control switches 240-252, and such modifications are included within the scope of the various embodiments.

Various phases in the provision of the switch control signals 301-309 correspond to various operational states of gain stage circuit 200. More particularly, and as will be described in more detail below, phase 310 of the switch control signals 301-309 corresponds to a sampling state (i.e., a state represented in FIG. 4), phase 320 corresponds to an approximate output voltage storage state (i.e., a state represented in FIG. 5), phase 330 corresponds to a level shifting and gain state (i.e., a state represented in FIG. 6), and phase 340 corresponds to an output state (i.e., a state represented in FIG. 7). According to an embodiment, the switch control signals 301-309 are provided in a manner such that the transitions of switches 240-252 between one phase and another are non-overlapping (e.g., at the end of phase 310, the P1 signal 301 transitions low before the P2 signal 302 transitions high).

Phase 310 of the switch control signals 301-309 corresponds to the sampling state of gain stage circuit 200. In the sampling state, signals P1 301, P123 306, and P12 307 are high, and signals P2 302, P3 303, P4 304, P234 305, P23 308, and P34 309 are low. Accordingly, switches 240, 241, 245, 246, and 248-250 (responsive to signals P1 301, P123 306, and P12 307) are closed, and switches 242, 244, 243, 251, and 252 (responsive to signals P2 302, P4 304, P234 305, P23 308, and P34 309) are open. This configuration is represented in FIG. 4, which is a simplified schematic diagram of the gain stage circuit 200 in the sampling state, according to an example embodiment.

Figure 4:
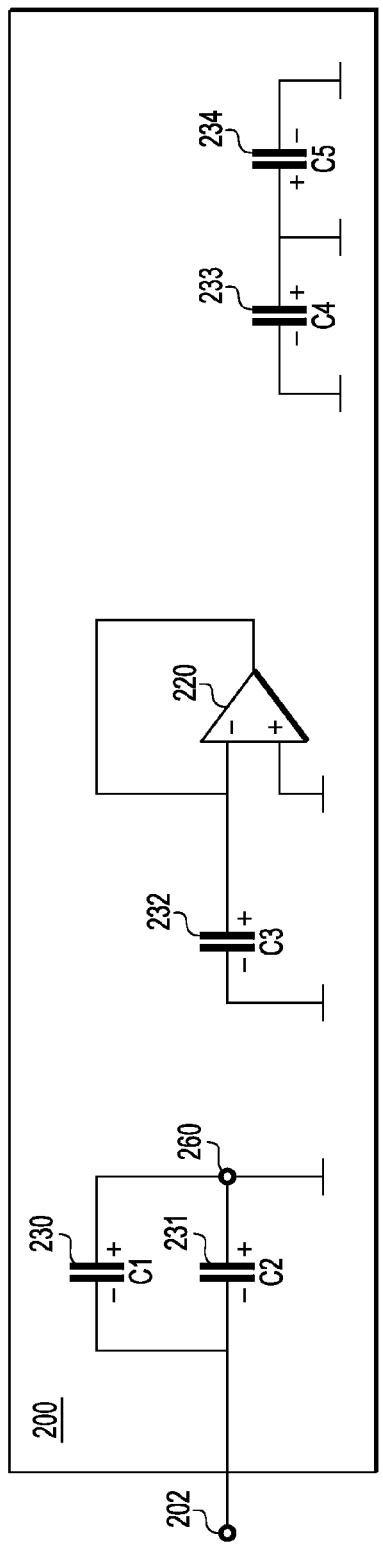
FIG. 4 is a simplified schematic diagram of the gain stage circuit of FIG. 2 in a sampling state, according to an example embodiment.

Referring to FIG. 4, it can be seen that, in the sampling state, capacitors C1 230 and C2 231 are coupled in parallel between the input node 202 and central node 260. Accordingly, the circuit 200 is configured so that capacitors C1 230 and C2 231 may sample and store charge components representing the value of the input signal present on input node 202 (e.g., each of capacitors C1 230, C2 231 sample the input signal voltage). For convenience, capacitors C1 230 and C2 231 may be referred to as "input sampling capacitors," herein. According to an embodiment, capacitors C1 230 and C2 231 have substantially equal values (e.g., they are "matched"), and accordingly the gain, $G_v$, of the gain stage circuit 200 equals approximately two (2) (i.e., $G_v=(C1+C2)/C1$). In various alternate embodiments, more than two capacitor legs may be coupled in parallel between the input and central nodes 202, 260, which may yield different voltage gains for the gain stage circuit 200. In addition, in other embodiments, the various input sampling capacitors may not be matched.

In addition, in the sampling state, capacitor C3 232 is decoupled from the central node 260, and is coupled between the inverting input of amplifier 220 and a ground reference. The output and inverting input of amplifier 220 are coupled, yielding unity gain from amplifier 220. In this configuration, capacitor C3 232 stores a charge component representing the voltage offset ($v_{OS}$) developed within amplifier 220 (referred to herein as the "amplifier offset voltage" or "input referred offset voltage"). In other words, $v_{OS}$ developed inside amplifier 220 is referred to the inverting input and to capacitor C3 232. Capacitor C3 232 also stores a charge component representing flicker noise (also referred to as "1/f" noise). As will be described in more detail later, the charge components stored on capacitor C3 232 are later applied through the gain stage circuit 200 in a manner that avoids amplifying the voltage offset and flicker noise, and thus that avoids or suppresses detrimental effects that these signal energies otherwise would have on the accuracy of the amplification provided by the gain stage circuit 200. For convenience, capacitor C3 232 may be referred to as an "offset storage capacitor," herein, although it is to be understood that capacitor C3 232 may store charge components representing energies in addition to the amplifier offset voltage (e.g., also the flicker noise).

Finally, in the sampling state, the fourth and fifth capacitors C4 233, C5 234 have both ends coupled with a ground reference. Accordingly, capacitors C4 233, C5 234 may discharge when gain stage circuit 200 is in the sampling state. For convenience, capacitor C4 233 may be referred to as a "level shifting capacitor," and capacitor C5 234 may be referred to as a "load capacitor," herein. As will be described in more detail later, capacitor C4 233 is used to store a voltage representing an approximate value of the output voltage, and capacitor C5 234 represents a load capacitance.

Referring again to FIG. 3, phase 320 of the switch control signals 301-309 corresponds to the approximate output voltage storage state of gain stage circuit 200. In the approximate output voltage storage state, signals P2 302, P234 305, P123 306, P12 307, and P23 308 are high, and signals P1 301, P3 303, P4 304, and P34 309 are low. Accordingly, switches 244, 245, 247, 249, 251, and 252 (responsive to signals P2 302, P234 305, P123 306, P12 307, and P23 308) are closed, and switches 240-243, 246, 248, and 250 (responsive to signals P1 301, P3 303, P4 304, and P34 309) are open. This configuration is represented in FIG. 5, which is a simplified schematic diagram of the gain stage circuit 200 in the approximate output voltage storage state, according to an example embodiment.

Figure 5:
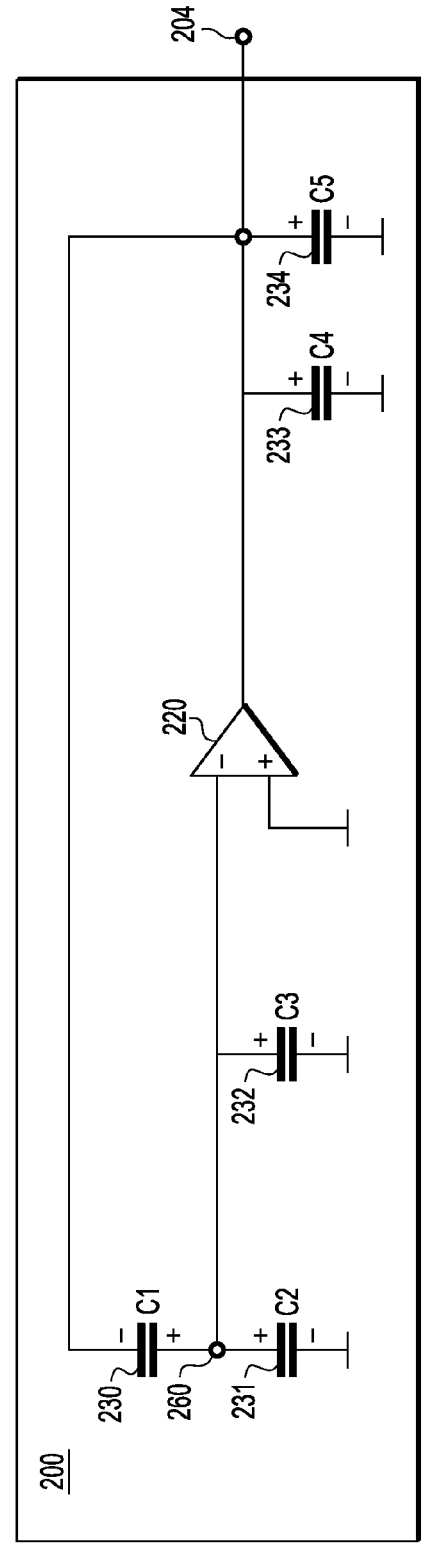
FIG. 5 is a simplified schematic diagram of the gain stage circuit of FIG. 2 in an approximate output voltage storage state, according to an example embodiment.

Referring to FIG. 5, it can be seen that, in the approximate output voltage storage state, capacitor C1 230 is coupled between the central node 260 and the output of amplifier 220, capacitor C2 231 is coupled between the central node 260 and a ground reference, and capacitor C3 232 is coupled, at a first terminal, to the central node 260 and the inverting input to amplifier 220, and at a second terminal to a ground reference. In this configuration, a charge component representing an approximate value of the output voltage is stored on capacitor C4 233. In an embodiment in which switches 244 and 246 are coupled to different ground references (e.g., different reference voltages), the ground reference voltage to which switch 244 is coupled is multiplied by the ratio of capacitor C2 231 over capacitor C1 230, and the resulting voltage is subtracted from the output voltage during the time when switch 252 is closed.

Figure 6:
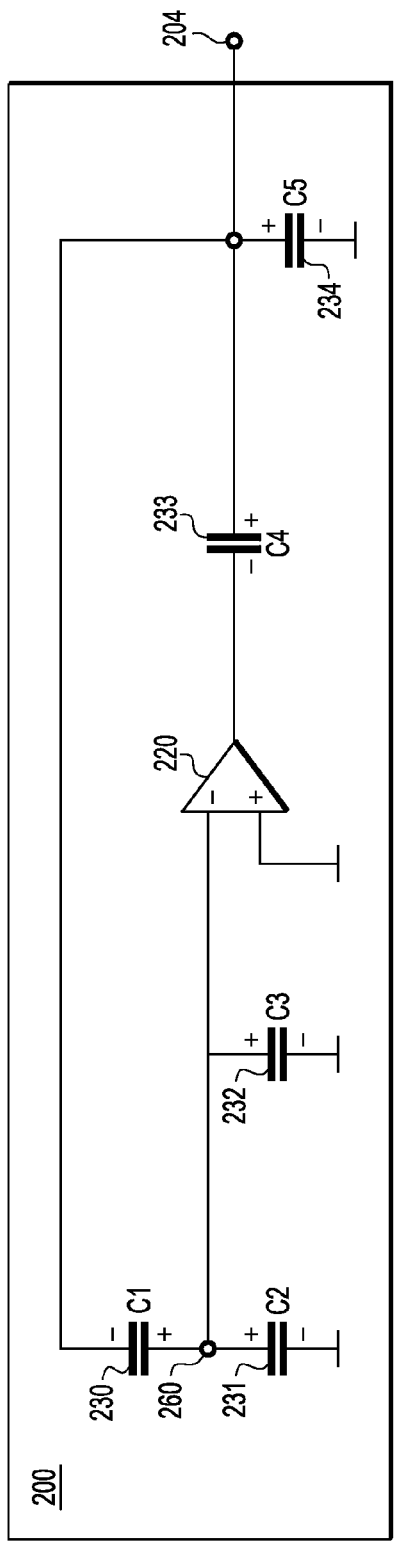
FIG. 6 is a simplified schematic diagram of the gain stage circuit of FIG. 2 in a level shifting and gain state, according to an example embodiment.

Referring again to FIG. 3, phase 330 of the switch control signals 301-309 corresponds to the level shifting and gain state of gain stage circuit 200. In the level shifting and gain state, signals P3 303, P234 305, P123 306, P23 308, and P34 309 are high, and signals P1 301, P2 302, P4 304, and P12 307 are low. Accordingly, switches 244-245, 247, and 252 (responsive to signals P234 305, P123 306, P23 308, and P34 309) are closed, and switches 240-242, 246, and 248-251 (responsive to signals P1 301, P2 302, P4 304, and P12 307 are low) are open. This configuration is represented in FIG. 6, which is a simplified schematic diagram of the gain stage circuit 200 in the level shifting and gain state, according to an example embodiment.

In the level shifting and gain state, charge components representing the amplifier offset voltage and flicker noise remain on capacitor C3 232, along with a charge component (e.g., derived from the signal being processed) that represents the finite amplifier gain. In addition, the output of amplifier 220 is level shifted to a mid common mode point (e.g., zero volts).

Referring again to FIG. 3, phase 340 of the switch control signals 301-309 corresponds to the output state of gain stage circuit 200. In the output state, signals P4 304, P234 305, and P34 309 are high, and signals P1 301, P2 302, P3 303, P123 306, P12 307, and P23 308 are low. Accordingly, switches 242-244 and 252 (responsive to signals P4 304, P234 305, and P34 309) are closed, and switches 240, 241, 245-251 (responsive to signals P1 301, P2 302, P123 306, P12 307, and P23 308) are open. This configuration is represented in FIG. 7, which is a simplified schematic diagram of the gain stage circuit 200 in the output state, according to an example embodiment.

Figure 7:
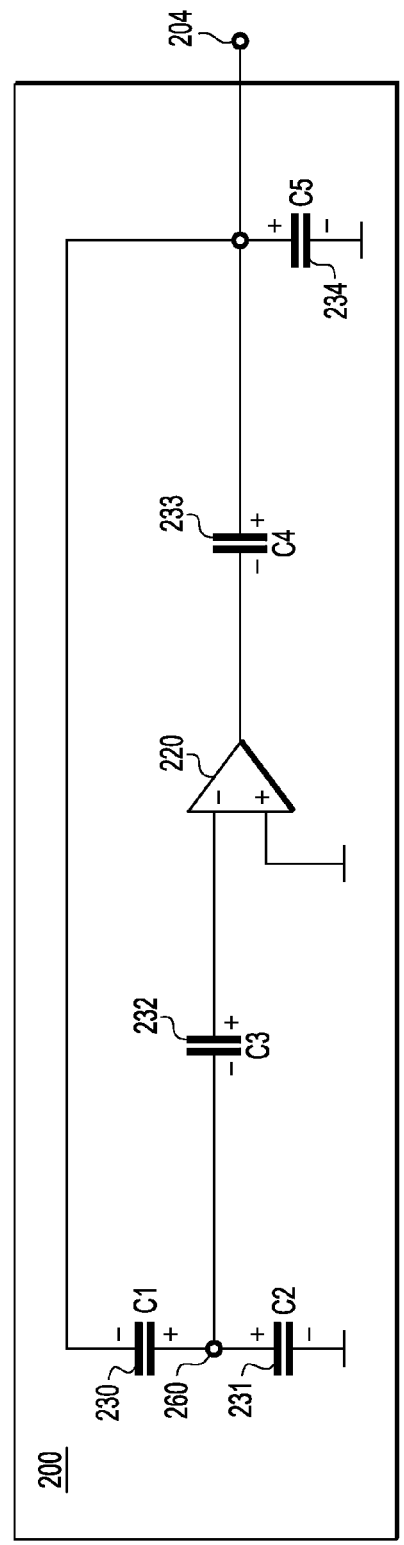
FIG. 7 is a simplified schematic diagram of the gain stage circuit of FIG. 2 in an output state, according to an example embodiment.

Referring to FIG. 7, it can be seen that, in the output state, the configuration of capacitors C1 and C2 230, 231 has not changed, but capacitor C3 232 has been coupled at the first terminal to the inverting input to amplifier 220, and at the second terminal to the central node 260. At this point, the voltage at the central node 260 drops to zero, which represents a desirable situation. In this configuration, the output voltage, $v_{OUT}$, present at output node 204 represents a voltage signal that includes contributions from the input sample charge components stored on input sampling capacitors C1 and C2 230, 231, charge components stored on offset storage capacitor C3 232 (which represent the amplifier offset voltage, the flicker noise, and the finite gain of amplifier 220), and a charge component stored on correlated level shifting capacitor C4 233, which represents an approximate value of the output voltage. In this manner, the output voltage represents a signal in which the amplifier offset voltage has been cancelled, the flicker noise has been suppressed (e.g., substantially filtered out), and the finite gain of amplifier 220 has been compensated. In addition, because the approximate value of the output voltage was stored on capacitor C4 233 in the approximate output voltage storage state (e.g., the state corresponding to phase 320), and the amplifier 220 was level shifted (e.g., to zero volts) in the level shifting and gain state (e.g., the state corresponding to phase 330), degradation of the output voltage is avoided, which otherwise may have occurred due to the finite gain of amplifier 220 (i.e., if the approximate output voltage storage state and level shifting and gain state were not implemented). Accordingly, gain stage circuit 200 produces an output voltage that is more accurate than is achievable using prior circuits that do not account for amplifier offset voltage, flicker noise, and/or the finite gain of amplifier 220. In addition, the output voltage may have a range that approaches or exceeds the supply voltage without degradation due to the finite gain of amplifier 220.

During the approximate output voltage storage state of gain stage circuit 200 (e.g., phase 320 represented by the configuration of FIG. 5), the output voltage, $v_{OUT}^{p2}$, at the output node 204 may be represented by the following equation:

$$v_{OUT}^{p2} = \frac{v_{IN} G_v}{\left(1 + \frac{1}{A_v \beta_1}\right)} + \frac{v_{OS}\left(\frac{1}{A_v \beta_1} + G_v\right)}{\left(1 + \frac{1}{A_v}\right)\left(1 + \frac{1}{A_v \beta_1}\right)},$$

where $$G_v = \frac{C_1 + C_2}{C_1},$$

$$\beta_1 = \frac{C_1}{C_1 + C_2 + C_3 + C_{px}},$$

$A_v$ represents the open loop gain of amplifier 220, and $C_{px}$ represents the parasitic capacitance between the inverting node of amplifier 220 and a ground reference.

During the level shifting and gain state of gain stage circuit 200 (e.g., phase 330 represented by the configuration of FIG. 6), the output voltage, $v_{OUT}^{p3}$, at the output node 204 may be represented by the following equation:

$$v_{OUT}^{p3} = \frac{v_{IN} G_v \left(1 + \frac{1}{A_v \beta_{5b}}\right)}{\left(1 + \frac{1}{A_v \beta_1}\right)\left(1 + \frac{1}{A_v \beta_{4a}}\right)} + \frac{v_{OS}\left(\frac{1}{A_v \beta_1} + G_v\right)\left(1 + \frac{1}{A_v \beta_{5b}}\right)}{\left(1 + \frac{1}{A_v}\right)\left(1 + \frac{1}{A_v \beta_{4a}}\right)},$$

where $$\beta_{5b} = \frac{C_1 C_4}{C_1(C_2 + C_3 + C_5 + C_{px}) + C_5(C_2 + C_3 + C_{px}) + 2 C_4(C_1 + C_2 + C_3 + C_{px})},$$

and $$\beta_{4a} = \frac{C_1 C_4}{C_1(C_2 + C_3 + C_5 + C_{px}) + C_5(C_2 + C_3 + C_{px}) + C_4(C_1 + C_2 + C_3 + C_{px})}.$$

Those of skill in the art would know how to formulate an equation to represent the output voltage at the output node 204 during the output state of gain stage circuit 200 (e.g., phase 340 represented by the configuration of FIG. 7). Such an equation is not included here due to its complexity.

Figure 8:
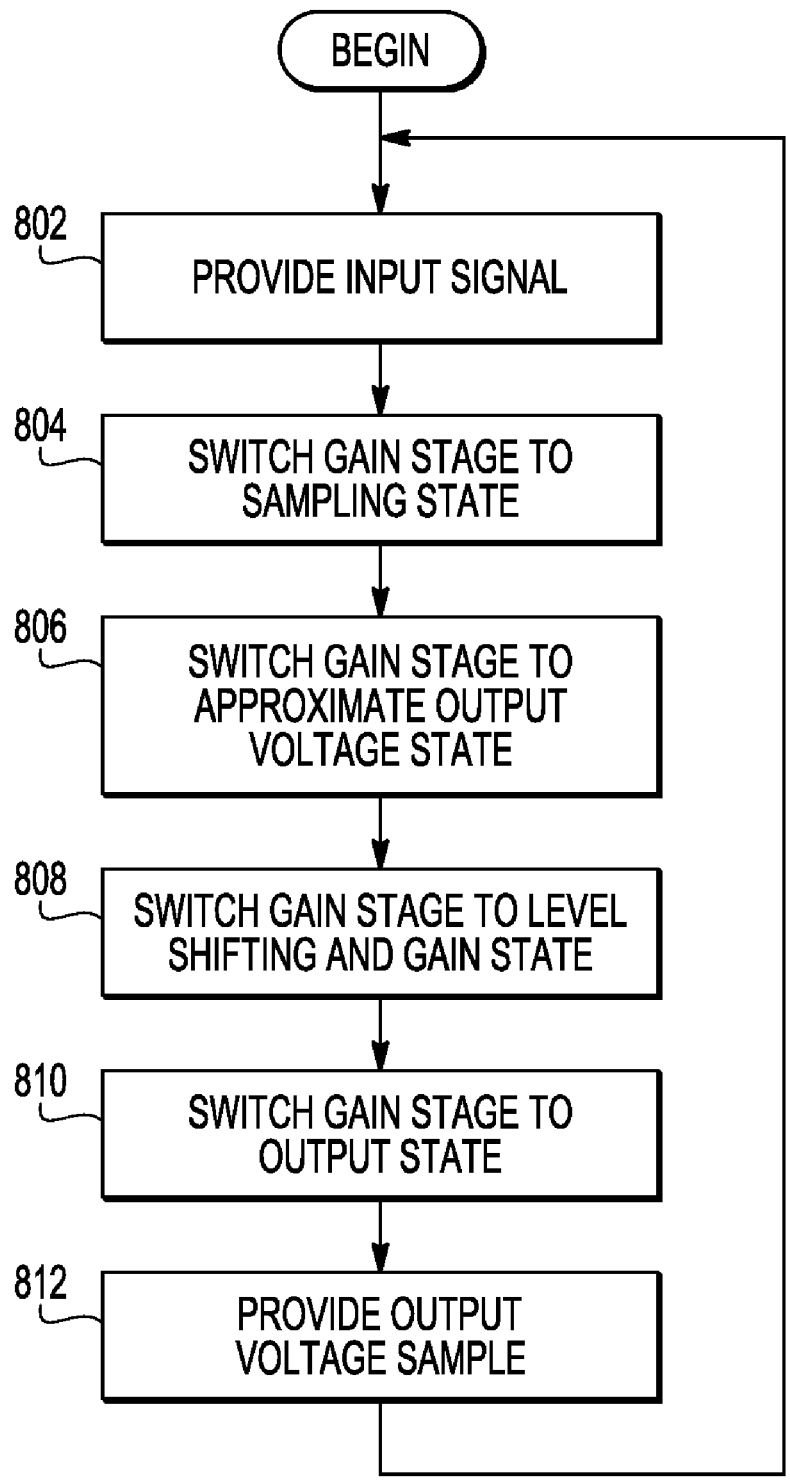
FIG. 8 is a flowchart of a method for operating an embodiment of a gain stage circuit, according to an example embodiment.

To summarize the state transitions implemented in the gain stage circuit 200, FIG. 8 is provided, which is a flowchart of a method for operating gain stage circuit 200, according to an example embodiment. Essentially, embodiments of methods for operating gain stage circuit 200 include first sampling the input signal (block 804), next performing a correlated-level-shifting process (blocks 806, 808), and subsequently performing a correlated-double-sampling process (block 810) to produce an output signal. The method begins, in block 802, by providing an input signal at an input node 202 of the gain stage circuit 200. In block 804, switch control signals (e.g., signals 301-309, FIG. 3) are provided by switch control circuit 270, in order to place the gain stage circuit 200 in a sampling state (e.g., the state represented in FIG. 4). In this state, charge components representing the input voltage, $v_{IN}$, are stored on the sampling capacitors (e.g., capacitors C1 230 and C2 231), charge components representing the voltage offset, $v_{OS}$, and flicker noise are stored on the offset storage capacitor (e.g., capacitor C3 232), and the correlated-level-shifting and load capacitors (e.g., capacitors C4 233, C5 234) are discharged.

Next, in block 806, switch control signals are provided to place the gain stage circuit 200 in an approximate output voltage storage state (e.g., the state represented in FIG. 5). In this state, a charge component representing an approximate value of the output voltage is stored on the correlated-level-shifting capacitor (e.g., capacitor C4 233). Next, in block 808, switch control signals are provided to place the gain stage circuit 200 in a level shifting and gain state (e.g., the state represented in FIG. 6). In this state, charge components representing the amplifier offset voltage and flicker noise remain on the offset storage capacitor (e.g., capacitor C3 232), along with a charge component that represents the finite amplifier gain. In addition, the output of the amplifier (e.g., amplifier 220) is level shifted to a mid common mode point (e.g., zero volts).

Then, in block 810, switch control signals are provided to place the gain stage circuit 200 in an output state (e.g., the state represented in FIG. 7). In this state, the output voltage, $v_{OUT}$, is present at the output node (e.g., output node 204). As described above, the output voltage represents a voltage signal in which the charge components representing the input signal, the amplifier offset voltage, the flicker noise, and the finite gain of the amplifier contribute to the output signal, resulting in cancellation of the amplifier offset voltage, suppression of the flicker noise, and compensation for the finite gain of amplifier 220. In addition, the output voltage may have a magnitude that may exceed an output voltage that would otherwise be achievable if the approximate output voltage were not stored (e.g., in the approximate output voltage storage state) and the amplifier were not level shifted (e.g., in the level shifting and gain state).

At this point, the output voltage represents a valid sample of an amplified version of the input signal. Accordingly, in block 812, the output voltage sample may then be provided to and further processed by additional circuitry with which the gain stage circuit 200 is implemented (e.g., by A/D converter 108 and processor 110, FIG. 1). The method then iterates as shown.

Figure 9:
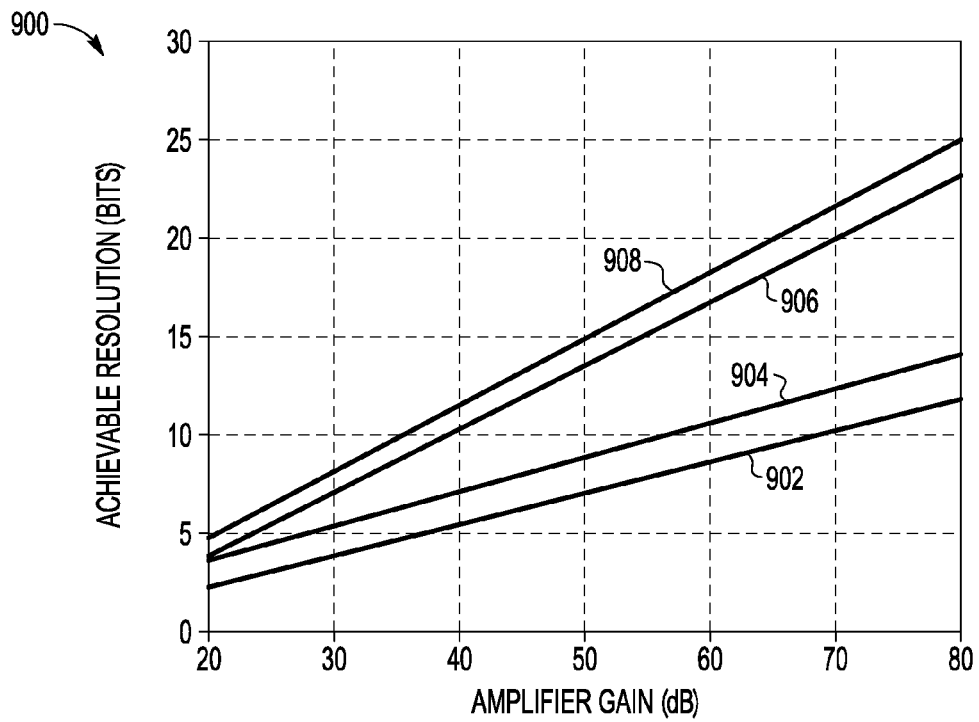
FIG. 9 is a graph plotting amplifier gain versus resolution to compare performance of an embodiment of a gain stage and a prior gain stage.
Figure 10:
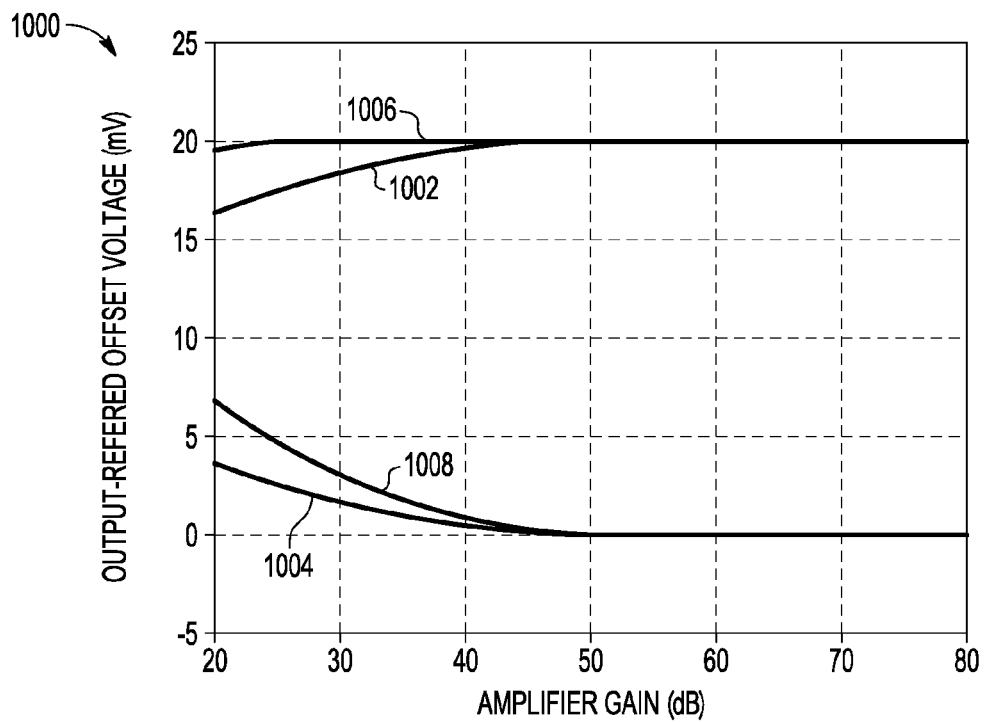
FIG. 10 is a graph plotting amplifier gain versus output-referred offset voltage to compare performance of an embodiment of a gain stage and a prior gain stage.

The previously discussed characteristics of the above-described embodiments of gain stage circuits and methods of their operation may yield significant performance benefits. FIGS. 9-10 are graphs comparing characteristics of other types of gain stages with characteristics of a gain stage in accordance with an embodiment. For example, FIG. 9 is a graph 900 plotting amplifier gain versus resolution to compare performance of an embodiment of a gain stage and several other gain stages. This performance metric may be relevant, for example, when a gain stage circuit is incorporated into a system that includes an A/D converter (e.g., as an input stage), where the "achievable resolution" represents the achievable resolution (in bits) of the A/D converter. Trace 902 indicates the amplifier gain versus resolution characteristics of a prior gain stage in which neither correlated-double-sampling nor correlated-level-shifting are performed, trace 904 indicates the amplifier gain versus resolution characteristics of a gain stage in which only correlated-double-sampling (but not correlated-level-shifting) is performed, trace 906 indicates the amplifier gain versus resolution characteristics of a gain stage in which only correlated-level-shifting (but not correlated-double-sampling) is performed, and trace 908 indicates the amplifier gain versus resolution characteristics of a gain stage circuit according to an embodiment (e.g., circuit 200, FIG. 2, in which both correlated-double-sampling and correlated-level-shifting are performed). As the graph 900 indicates, when comparing the performance of a prior gain stage (e.g., represented by trace 902) and embodiments of a gain stage circuit disclosed herein (e.g., represented by trace 908), implementation of a gain stage embodiment may result in an increase of about two to thirteen bits of resolution over a wide range of amplifier gain values (e.g., at an amplifier gain of 20 dB, a prior circuit has about three bits of resolution, and a gain stage circuit of an embodiment has about five bits of resolution, and at an amplifier gain of 80 dB, a prior circuit has about twelve bits of resolution, and a gain stage circuit of an embodiment has about twenty five bits of resolution).

FIG. 10 is a graph 1000 plotting amplifier gain versus output-referred offset voltage to compare performance of an embodiment of a gain stage and a several other gain stages. Trace 1002 indicates the amplifier gain versus output-referred offset voltage of a prior gain stage in which neither correlated-double-sampling nor correlated-level-shifting are performed, trace 1004 indicates the amplifier gain versus output-referred offset voltage of a gain stage in which only correlated-double-sampling (but not correlated-level-shifting) is performed, trace 1006 indicates the amplifier gain versus output-referred offset voltage of a gain stage in which only correlated-level-shifting (but not correlated-double-sampling) is performed, and trace 1008 indicates the amplifier gain versus output-referred offset voltage of a gain stage circuit according to an embodiment (e.g., circuit 200, FIG. 2, in which both correlated-double-sampling and correlated-level-shifting are performed). As the graph 1000 indicates, embodiments of a gain stage circuit may result in a significant decrease in the output-referred offset voltage across a wide range of amplifier gain values (e.g., at an amplifier gain of 60 dB, trace 1002 indicates that a prior circuit has about 20 millivolts (mV) of output-referred offset voltage, and trace 1008 indicates that a gain stage of an embodiment has almost zero output-referred offset voltage).

Figure 11:
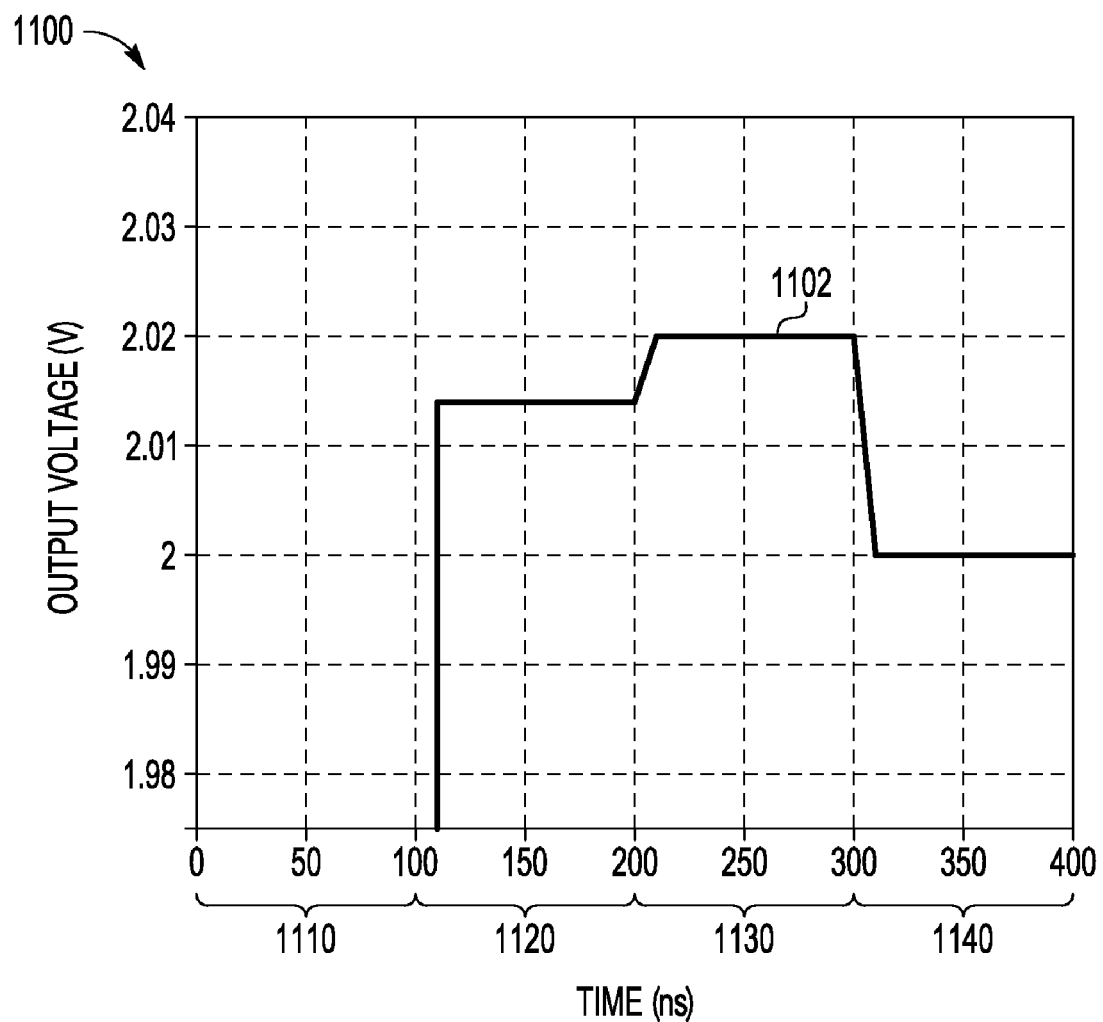
FIG. 11 is a graph plotting output voltage over time for an embodiment of a gain stage.

Finally, FIG. 11 is a graph 1100 plotting voltages, over time, which are present at the output node (e.g., output node 204, FIG. 2) of a gain stage circuit according to an embodiment. In the example, an ideal output voltage is 2 volts, and an input offset is 10 millivolts. The time axis includes four segments 1110, 1120, 1130, 1140, which represent the four sequential states implemented in the gain stage circuit (i.e., segment 1110 corresponds to the sampling state, segment 1120 corresponds to the approximate output voltage storage state, segment 1130 corresponds to the level shifting and gain state, and segment 1140 corresponds to the output state). According to an embodiment, the output voltage is only valid during the output state (segment 1140).

As trace 1102 shows, the output voltage is essentially zero during the sampling state (segment 1110). During the approximate output storage state (segment 1120), the output voltage increases to a level exceeding the ideal output voltage. More particularly, the output voltage includes a first component representing the sampled input, as well as a component representing the amplifier input offset voltage. The output voltage also may include flicker noise. Essentially, the output voltage indicated in segment 1120 corresponds to a final output voltage that likely would be achieved using a prior device. In an embodiment, however, the output voltage is not valid during segment 1120.

During the approximate output voltage storage state (segment 1130), the output voltage again may increase to a value that includes a first component representing the sampled input, as well as a component representing an amplified version of the amplifier input offset voltage (e.g., with amplification of two). Finally, during the output state (segment 1140), the output voltage includes a component representing the sampled input, but the effect of the amplifier input offset voltage has been cancelled (along with flicker noise cancellation and a gain enhancement). Accordingly, when the output voltage is valid, the output voltage is at or near the ideal output voltage of 2 volts.

Along with the performance and other benefits discussed above, embodiments may have other advantages over prior circuits, as well. For example, the above-described embodiments enable significantly more accurate, amplified voltage signals to be produced without adding significant additional hardware to the system. As described above, an embodiment may be implemented with the addition of five capacitors and a switching configuration designed to interconnect the various components of the gain stage circuit in configurations that enable the accurate output signal to be produced.

In addition, embodiments of gain stage circuits and methods of their operation described herein do not significantly limit the frequencies of input signals (e.g., the signal bandwidth) that may be processed by the circuit embodiments. As previously described, the only period during which the input signal is coupled to the sampling capacitors is during the sampling stage (FIG. 4). At all other times, the input signal is decoupled from the gain stage circuit. Accordingly, the gain stage circuit does not limit the frequency of the input signal. In addition, embodiments of gain stage circuits and methods of their operation described herein enable accurate output signals to be produced by compensating for finite amplifier gain and limited output swing.

Thus, various embodiments of gain stage circuits and methods of their operation have been described above. An embodiment of a switched-capacitor gain stage circuit has an input node and an output node, and also includes an operational amplifier, a correlated-double-sampling portion, a correlated-level-shifting portion, and a switching configuration. The operational amplifier has a first amplifier input, a second amplifier input, and an amplifier output. The correlated-double-sampling portion includes a plurality of sampling capacitors arranged in parallel and selectively coupled between the input node and a central node, and an offset storage capacitor including a first terminal coupled to the first amplifier input. The correlated-level-shifting portion includes a correlated-level-shifting capacitor including a first terminal coupled to the output node. The switching configuration has multiple switches that are controllable sequentially to place the gain stage circuit in a sampling state, an approximate output voltage storage state, a level shifting and gain state, and an output state.

In a further embodiment, in the sampling state, the multiple switches are configured so that a first charge component representing an input signal on the input node is stored on the sampling capacitors, and a second charge component representing an amplifier offset voltage is stored on the offset storage capacitor. In the approximate output voltage storage state, the multiple switches are configured so that a third charge component representing an approximate value of the output voltage is stored on the correlated-level-shifting capacitor. In the level shifting and gain state, the multiple switches are configured so that a fourth charge component representing a finite gain of the amplifier is stored on the offset storage capacitor and the operational amplifier is level shifted. In the output state, the multiple switches are configured so that the first, second, third, and fourth charge components contribute to an output signal produced at the output node.

In yet a further embodiment, contribution of the second charge component to the output signal causes cancellation of the amplifier offset voltage from the output signal, and contribution of the fourth charge component to the output signal results in a gain enhancement to the output signal.

In another further embodiment the multiple switches are configured, in the sampling state, to connect first terminals of the plurality of sampling capacitors to the input node, and to connect second terminals of the plurality of sampling capacitors to a first ground reference, to connect a second terminal of the offset storage capacitor to a second ground reference, to connect the amplifier output to the first amplifier input, and to connect first and second terminals of the correlated-level-shifting capacitor to a third ground reference.

In yet another further embodiment, the multiple switches are configured, in the approximate output voltage storage state, to connect a first terminal of a first one of the plurality of sampling capacitors to a first ground reference, and to connect a first terminal of a second one of the plurality of sampling capacitors to the amplifier output, to connect the first terminal of the offset storage capacitor to the central node and to the first amplifier input, and to connect a second terminal of the offset storage capacitor to a second ground reference, to connect a first terminal of the correlated-level-shifting capacitor to the amplifier output, and to connect a second terminal of the correlated-level-shifting capacitor to a third ground reference.

In yet another further embodiment, the multiple switches are configured, in the level shifting and gain state, to connect a first terminal of a first one of the plurality of sampling capacitors to a first ground reference, and to connect a first terminal of a second one of the plurality of sampling capacitors to the amplifier output, to connect the first terminal of the offset storage capacitor to the central node and to the first amplifier input, and to connect a second terminal of the offset storage capacitor to a second ground reference, to connect a first terminal of the correlated-level-shifting capacitor to the output node, and to connect a second terminal of the correlated-level-shifting capacitor to the amplifier output.

In yet another further embodiment, the multiple switches are configured, in the output state, to connect the second terminals of the plurality of sampling capacitors to the central node, to connect a first terminal of a first one of the plurality of sampling capacitors to a ground reference, and to connect a first terminal of a second one of the plurality of sampling capacitors to the amplifier output, to connect a first terminal of the offset storage capacitor to the first amplifier input, and to connect a second terminal of the offset storage capacitor to the central node, to connect a first terminal of the correlated-level-shifting capacitor to the output node, and to connect a second terminal of the correlated-level-shifting capacitor to the amplifier output.

In yet another further embodiment, the plurality of storage capacitors includes a first sampling capacitor and a second sampling capacitor, and the multiple switches include a first switch coupled between the first sampling capacitor and the input node, a second switch coupled between the second sampling capacitor and the input node, a third switch coupled between the offset storage capacitor and a central node, a fourth switch coupled between the correlated-level-shifting capacitor and the amplifier output, a fifth switch coupled between the amplifier output and a first connection point between the first sampling capacitor and the first switch, a sixth switch coupled between a first ground reference and a second connection point between the second sampling capacitor and the second switch, a seventh switch coupled between a second ground reference and a third connection point between the offset storage capacitor and the third switch, an eighth switch coupled between a third ground reference and the central node, a ninth switch coupled between the central node and the first amplifier input, a tenth switch coupled between the amplifier output and the first amplifier input, an eleventh switch coupled between a fourth ground reference and a fourth connection point between the correlated-level-shifting capacitor and the fourth switch, a twelfth switch coupled between a fifth ground reference and the output node, and a thirteenth switch coupled in parallel with the correlated-level-shifting capacitor.

In yet another further embodiment, the multiple switches are configurable to place the gain stage circuit first in the sampling state, second in the approximate output voltage storage state, third in the level shifting and gain state, and fourth in the output state in response to a plurality of switch control signals.

In yet another further embodiment, the circuit further includes a load capacitor including a first terminal coupled to the output node and a second terminal coupled to a ground reference.

An embodiment of an electronic system includes a switched-capacitor gain stage circuit including an input node, an output node, and a central node. The gain stage circuit includes an operational amplifier including a first amplifier input, a second amplifier input, and an amplifier output, a first capacitor that can be selectively coupled between the input node and the central node, a second capacitor coupled in parallel with the first capacitor, and that can be selectively coupled between the input node and the central node, a third capacitor coupled to the first amplifier input, and that can be selectively coupled to the central node, a fourth capacitor coupled to the output node, and a switching configuration including multiple switches that are configurable to place the gain stage circuit sequentially in a first configuration, a second configuration, a third configuration, and a fourth configuration. In the first configuration a first charge component representing an input signal on the input node is stored on the first and second capacitors, and a second charge component representing an amplifier offset voltage is stored on the third capacitor. In the second configuration, a third charge component representing an approximate value of an output voltage is stored on the fourth capacitor. In the third configuration, the amplifier is level shifted, and a fourth charge component representing a finite gain of the amplifier is stored on the third capacitor. In the fourth configuration, the first, second, third, and fourth charge components contribute to an output signal produced at the output node.

In a further embodiment, the electronic system is an analog to digital converter, and the gain stage circuit is an input stage to the analog to digital converter. In another further embodiment, the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

An embodiment of a method for applying a gain to an input signal is performed in a switched-capacitor gain stage circuit including an input node, an output node, a first sampling capacitor, a second sampling capacitor, and an operational amplifier including a first amplifier input, a second amplifier input, and an amplifier output. The method includes the steps of first configuring multiple switches of the gain stage circuit in a first configuration in which a first charge component representing an input signal on the input node is stored on the first and second sampling capacitors, and a second charge component representing an amplifier offset voltage is stored on a third capacitor that has a first terminal coupled to the first amplifier input. The method also includes second configuring the multiple switches in a second configuration in which a third charge component representing an approximate output voltage is stored on a fourth capacitor that has a first terminal coupled to the output node. The method also includes third configuring the multiple switches in a third configuration in which the amplifier is level shifted, and a fourth charge component representing a finite gain of the amplifier is stored on the third capacitor. The method also includes fourth configuring the multiple switches in a fourth configuration in which the first, second, third, and fourth charge components contribute to an output signal produced at the output node.

In a further embodiment, configuring the multiple switches in the first configuration includes connecting first terminals of the first and second sampling capacitors to the input node, where second terminals of the first and second sampling capacitors are connected to a central node, connecting the central node to a first ground reference, connecting a second terminal of the third capacitor to a second ground reference, and connecting the amplifier output to the first amplifier input. In a further embodiment, configuring the multiple switches in the second configuration includes disconnecting the first terminals of the first and second capacitors from the input node, disconnecting the amplifier output from the first amplifier input, disconnecting the central node from the first ground reference, connecting the first terminal of the first sampling capacitor to the output node, connecting the first terminal of the second sampling capacitor to a third ground reference, connecting the first terminal of the third capacitor to the central node, connecting the first terminal of the fourth capacitor to the amplifier output, and connecting a second terminal of the fourth capacitor to a fourth ground reference. In a still further embodiment, configuring the multiple switches in the third configuration includes disconnecting the first terminal of the fourth capacitor from the amplifier output, disconnecting the second terminal of the fourth capacitor from the fourth ground reference, connecting the first terminal of the fourth capacitor to the output node, and connecting the second terminal of the fourth capacitor to the amplifier output. In a still further embodiment, configuring the multiple switches in the fourth configuration includes disconnecting the first terminal of the third capacitor from the central node, disconnecting the second terminal of the third capacitor from the second ground reference, and connecting the second terminal of the third capacitor to the central node.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A switched-capacitor gain stage circuit including an input node and an output node, the circuit comprising:
    an operational amplifier including a first amplifier input, a second amplifier input, and an amplifier output;
    a correlated-double-sampling portion that includes
        a plurality of sampling capacitors arranged in parallel and selectively coupled between the input node and a central node, and
        an offset storage capacitor including a first terminal coupled to the first amplifier input;
    a correlated-level-shifting portion that includes
        a correlated-level-shifting capacitor including a first terminal coupled to the output node; and
    a switching configuration including multiple switches that are controllable to place the gain stage circuit in a sampling state, an approximate output voltage storage state, a level shifting and gain state, and an output state.

2. The circuit of claim 1, wherein:
    in the sampling state, the multiple switches are configured so that a first charge component representing an input signal on the input node is stored on the sampling capacitors, and a second charge component representing an amplifier offset voltage is stored on the offset storage capacitor,
    in the approximate output voltage storage state, the multiple switches are configured so that a third charge component representing an approximate value of the output voltage is stored on the correlated-level-shifting capacitor,
    in the level shifting and gain state, the multiple switches are configured so that a fourth charge component representing a finite gain of the amplifier is stored on the offset storage capacitor and an output of the operational amplifier is level shifted, and
    in the output state, the multiple switches are configured so that the first, second, third, and fourth charge components contribute to an output signal produced at the output node.

3. The circuit of claim 2, wherein contribution of the second charge component to the output signal causes cancellation of the amplifier offset voltage from the output signal, and contribution of the fourth charge component to the output signal results in a gain enhancement to the output signal.

4. The circuit of claim 1, wherein the multiple switches are configured, in the sampling state:
to connect first terminals of the plurality of sampling capacitors to the input node, and to connect second terminals of the plurality of sampling capacitors to a first ground reference,
to connect a second terminal of the offset storage capacitor to a second ground reference,
to connect the amplifier output to the first amplifier input, and
to connect first and second terminals of the correlated-level-shifting capacitor to a third ground reference.

5. The circuit of claim 1, wherein the multiple switches are configured, in the approximate output voltage storage state:
to connect a first terminal of a first one of the plurality of sampling capacitors to a first ground reference, and to connect a first terminal of a second one of the plurality of sampling capacitors to the amplifier output,
to connect the first terminal of the offset storage capacitor to the central node and to the first amplifier input, and to connect a second terminal of the offset storage capacitor to a second ground reference,
to connect a first terminal of the correlated-level-shifting capacitor to the amplifier output, and
to connect a second terminal of the correlated-level-shifting capacitor to a third ground reference.

6. The circuit of claim 1, wherein the multiple switches are configured, in the level shifting and gain state:
to connect a first terminal of a first one of the plurality of sampling capacitors to a first ground reference, and to connect a first terminal of a second one of the plurality of sampling capacitors to the amplifier output,
to connect the first terminal of the offset storage capacitor to the central node and to the first amplifier input, and to connect a second terminal of the offset storage capacitor to a second ground reference,
to connect a first terminal of the correlated-level-shifting capacitor to the output node, and
to connect a second terminal of the correlated-level-shifting capacitor to the amplifier output.

7. The circuit of claim 1, wherein the multiple switches are configured, in the output state:
to connect the second terminals of the plurality of sampling capacitors to the central node, to connect a first terminal of a first one of the plurality of sampling capacitors to a ground reference, and to connect a first terminal of a second one of the plurality of sampling capacitors to the amplifier output,
to connect a first terminal of the offset storage capacitor to the first amplifier input, and to connect a second terminal of the offset storage capacitor to the central node,
to connect a first terminal of the correlated-level-shifting capacitor to the output node, and
to connect a second terminal of the correlated-level-shifting capacitor to the amplifier output.

8. The circuit of claim 1, wherein:
the plurality of storage capacitors comprises a first sampling capacitor and a second sampling capacitor; and
the multiple switches comprise
a first switch coupled between the first sampling capacitor and the input node, a second switch coupled between the second sampling capacitor and the input node,
a third switch coupled between the offset storage capacitor and a central node,
a fourth switch coupled between the correlated-level-shifting capacitor and the amplifier output,
a fifth switch coupled between the amplifier output and a first connection point between the first sampling capacitor and the first switch,
a sixth switch coupled between a first ground reference and a second connection point between the second sampling capacitor and the second switch,
a seventh switch coupled between a second ground reference and a third connection point between the offset storage capacitor and the third switch,
an eighth switch coupled between a third ground reference and the central node,
a ninth switch coupled between the central node and the first amplifier input,
a tenth switch coupled between the amplifier output and the first amplifier input,
an eleventh switch coupled between a fourth ground reference and a fourth connection point between the correlated-level-shifting capacitor and the fourth switch,
a twelfth switch coupled between a fifth ground reference and the output node, and
a thirteenth switch coupled in parallel with the correlated-level-shifting capacitor.

9. The circuit of claim 1, wherein the multiple switches are configurable to place the gain stage circuit first in the sampling state, second in the approximate output voltage storage state, third in the level shifting and gain state, and fourth in the output state in response to a plurality of switch control signals.

10. The circuit of claim 1, wherein the circuit further comprises:
a load capacitor including a first terminal coupled to the output node and a second terminal coupled to a ground reference.

11. An electronic system comprising:
a switched-capacitor gain stage circuit including an input node, an output node, and a central node, the gain stage circuit including
an operational amplifier including a first amplifier input, a second amplifier input, and an amplifier output;
a first capacitor that can be selectively coupled between the input node and the central node;
a second capacitor coupled in parallel with the first capacitor, and that can be selectively coupled between the input node and the central node;
a third capacitor coupled to the first amplifier input, and that can be selectively coupled to the central node;
a fourth capacitor coupled to the output node, and
a switching configuration including multiple switches that are configurable to place the gain stage circuit sequentially in a first configuration, a second configuration, a third configuration, and a fourth configuration wherein,
in the first configuration first terminals of the first and second capacitors are connected to the input node, second terminals of the first and second capacitors are connected to the central node, the central node is connected to a first ground reference, a second terminal of the third capacitor is connected to a second ground reference, and the amplifier output is connected to the first amplifier input,
in the second configuration, the first terminals of the first and second capacitors are disconnected from the input node, the amplifier output is disconnected from the first amplifier input, the central node is disconnected from the first ground reference, the first terminal of the first capacitor is connected to the output node, the first terminal of the second capacitor is connected to a third ground reference, the first terminal of the third capacitor is connected to the central node, the first terminal of the fourth capacitor is connected to the amplifier output, and a second terminal of the fourth capacitor is connected to a fourth ground reference, in the third configuration, the first terminal of the fourth capacitor is disconnected from the amplifier output, the second terminal of the fourth capacitor is disconnected from the fourth ground reference, the first terminal of the fourth capacitor is connected to the output node, and the second terminal of the fourth capacitor is connected to the amplifier output, and in the fourth configuration, the first terminal of the third capacitor is disconnected from the central node, the second terminal of the third capacitor is disconnected from the second ground reference, and the second terminal of the third capacitor is connected to the central node.

12. The electronic system of claim 11, wherein the multiple switches comprise:
   a first switch coupled between the first capacitor and the input node;
   a second switch coupled between the second capacitor and the input node;
   a third switch coupled between the third capacitor and a central node;
   a fourth switch coupled between the fourth capacitor and the amplifier output;
   a fifth switch coupled between the amplifier output and a first connection point between the first capacitor and the first switch;
   a sixth switch coupled between a first ground reference and a second connection point between the second capacitor and the second switch;
   a seventh switch coupled between a second ground reference and a third connection point between the third capacitor and the third switch;
   an eighth switch coupled between a third ground reference and the central node;
   a ninth switch coupled between the central node and the first amplifier input;
   a tenth switch coupled between the amplifier output and the first amplifier input;
   an eleventh switch coupled between a fourth ground reference and a fourth connection point between the fourth capacitor and the fourth switch;
   a twelfth switch coupled between a fifth ground reference and the output node; and
   a thirteenth switch coupled in parallel with the fourth capacitor.

13. The electronic system of claim 12, further comprising:
   a switch control circuit coupled to the gain stage circuit, and configured to provide switch control signals to the multiple switches to sequentially place the gain stage circuit in the first, second, third, and fourth configurations.

14. The electronic system of claim 11, wherein the electronic system is an analog to digital converter, and the gain stage circuit is an input stage to the analog to digital converter.

15. The electronic system of claim 11, wherein the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

16. A method for applying a gain to an input signal, the method performed in a switched-capacitor gain stage circuit including an input node, an output node, a first sampling capacitor, a second sampling capacitor, and an operational amplifier including a first amplifier input, a second amplifier input, and an amplifier output, the method comprising the steps of:
   first configuring multiple switches of the gain stage circuit in a first configuration in which a first charge component representing an input signal on the input node is stored on the first and second sampling capacitors, and a second charge component representing an amplifier offset voltage is stored on a third capacitor that has a first terminal coupled to the first amplifier input;
   second configuring the multiple switches in a second configuration in which a third charge component representing an approximate output voltage is stored on a fourth capacitor that has a first terminal coupled to the output node;
   third configuring the multiple switches in a third configuration in which an output of the amplifier is level shifted, and a fourth charge component representing a finite gain of the amplifier is stored on the third capacitor; and
   fourth configuring the multiple switches in a fourth configuration in which the first, second, third, and fourth charge components contribute to an output signal produced at the output node.

17. The method of claim 16, wherein configuring the multiple switches in the first configuration comprises:
   connecting first terminals of the first and second sampling capacitors to the input node, wherein second terminals of the first and second sampling capacitors are connected to a central node;
   connecting the central node to a first ground reference;
   connecting a second terminal of the third capacitor to a second ground reference; and
   connecting the amplifier output to the first amplifier input.

18. The method of claim 17, wherein configuring the multiple switches in the second configuration comprises:
   disconnecting the first terminals of the first and second capacitors from the input node;
   disconnecting the amplifier output from the first amplifier input;
   disconnecting the central node from the first ground reference;
   connecting the first terminal of the first sampling capacitor to the output node;
   connecting the first terminal of the second sampling capacitor to a third ground reference;
   connecting the first terminal of the third capacitor to the central node;
   connecting the first terminal of the fourth capacitor to the amplifier output; and
   connecting a second terminal of the fourth capacitor to a fourth ground reference.

19. The method of claim 18, wherein configuring the multiple switches in the third configuration comprises:
   disconnecting the first terminal of the fourth capacitor from the amplifier output;
   disconnecting the second terminal of the fourth capacitor from the fourth ground reference;
   connecting the first terminal of the fourth capacitor to the output node; and connecting the second terminal of the fourth capacitor to the amplifier output.

20. The method of claim 19, wherein configuring the multiple switches in the fourth configuration comprises:
   disconnecting the first terminal of the third capacitor from the central node;
   disconnecting the second terminal of the third capacitor from the second ground reference; and
   connecting the second terminal of the third capacitor to the central node.

* * * * *